United States Patent
Dickey

(10) Patent No.: US 8,355,460 B2
(45) Date of Patent: Jan. 15, 2013

(54) RADIO TRANSMITTER SYSTEM AND METHOD

(75) Inventor: Daniel L. Dickey, Rowlett, TX (US)

(73) Assignee: Continental Electronics Corp., Dallas, TX (US)

( * ) Notice: Subject to any disclaimer, the term of this patent is extended or adjusted under 35 U.S.C. 154(b) by 37 days.

(21) Appl. No.: 13/114,392

(22) Filed: May 24, 2011

(65) Prior Publication Data

US 2012/0300870 A1    Nov. 29, 2012

(51) Int. Cl.
*H04L 27/10* (2006.01)

(52) U.S. Cl. .......... 375/274; 375/239; 375/305; 455/93; 332/100

(58) Field of Classification Search .......... 375/239, 375/240, 256, 259, 272, 274, 275, 295, 303, 375/305, 309, 315; 455/91, 107, 114.3, 112, 455/93; 332/100, 101, 102, 117, 120
See application file for complete search history.

(56) References Cited

U.S. PATENT DOCUMENTS

| | | | |
|---|---|---|---|
| 2,989,707 A | 6/1961 | Kahn | |
| 4,540,957 A | 9/1985 | Hanna | |
| 6,032,028 A * | 2/2000 | Dickey et al. | 455/110 |
| 7,760,818 B2 * | 7/2010 | Lee | 375/305 |
| 8,005,161 B2 * | 8/2011 | Katayama et al. | 375/274 |

OTHER PUBLICATIONS

"Least mean squares filter," http://en.wikipedia.org/wiki/Least_mean_squares_filter, Aug. 7, 2012.
Watt, A. D., VLF Radio Engineering, Library of Congress Catalog Card No. 67-18166, 1967, pp. 122-167.

* cited by examiner

*Primary Examiner* — Dac Ha
(74) *Attorney, Agent, or Firm* — Lowe, Hauptman, Ham & Berner, LLP

(57) ABSTRACT

A radio transmitter system responsive to a binary signal drives a narrow bandwidth VLF or LF antenna. A generator derives a first variable frequency wave frequency coded based on bit values of a binary signal. An arbitrary impulse response signal processor responsive to the first wave derives a first output signal having real and imaginary components representing the shape of a modulating wave having a variable amplitude envelope and the frequency of the coded values. A transmitter responsive to the processor output signal and a VLF or LF carrier supplies the antenna with another output signal including a modulation wave having a shape that is a substantial replica of the modulating wave shape. The processor causes the signal emitted by the antenna system to include modulation having a shape that is substantially the shape of the first wave.

31 Claims, 8 Drawing Sheets

RADIO TRANSMITTER SYSTEM AND METHOD

FIELD OF INVENTION

The present invention relates generally to radio transmitter systems and methods for generating a frequency modulated signal in response to a binary input signal and, more particularly, to such a transmitter system including an arbitrary impulse response signal processor. An added aspect of the invention relates to a radio transmitter system responsive to a binary signal for driving an antenna, wherein the system comprises a transmitter responsive to a frequency coded signal having envelope amplitude variations and that derives a wave having an amplitude that is linearly proportional to the envelope amplitude variations and frequencies that deviate linearly from the carrier frequency by an amount that is linearly proportional to the frequency variations of the frequency coded signal.

BACKGROUND

Data transmission using frequency shift keying (FSK) modulation of a radio frequency (RF) carrier wave is widely employed for transmitting digital data. A special case of spectrally efficient FSK is known as minimum shift keying (MSK). In MSK, two orthogonal signals represent the binary values 0 and 1. Typically a binary one is represented by a first frequency ($f_1$) and a binary zero is represented by a second frequency which equals $f_2$; the first and second frequencies have the same AC amplitude. Generators of MSK signals usually include an I-Q modulator having an input responsive to a binary data source and two mixers (that is, signal multipliers) responsive to orthogonal components of a carrier. The data rate of an MSK system is determined by the maximum frequency shift, i.e., frequency deviation or difference between $f_1$ and $f_2$. To preserve the orthogonal nature of MSK, the total frequency deviation equals the bit data rate divided by 2. For example, a typical very low frequency (VLF; between 3 kHz and 30 kHz) system in MSK mode with a frequency deviation of +/−50 Hz (i.e. 100 Hz total deviation) has a data rate equal to 100×2=200 bits per second. Any increase or decrease in data rate of an MSK system requires a corresponding change in frequency deviation.

MSK is often used in systems having transmit antennas with restricted useful bandwidth (typically 1 dB or less) because MSK is spectrally efficient. The wavelength of the RF carrier frequency frequently used in the VLF band is typically in the range of 10 to 30 kilometers. It is impractical to build a transmitting antenna large enough to be a significant fraction of these wavelengths. The typical VLF antennas, e.g., the antennas at the stations operated by the United States Navy in Maine and Hawaii for underwater radio communication, occupy about a thousand acres of land area and still are only a small fraction of a wavelength in height, despite having multiple transmitting towers that respectively have heights of 304 meters (997.5 feet) and 458.1 meters (1503 feet). The economics of land and construction costs put practical limits on the size of any high power VLF antenna; the tower in Maine radiates 1800 kilowatts of power at a frequency of 24.0 kHz, and can handle digital signals having up to a rate of 200 bits per second.

Based on the above, the useful bandwidth of a typical high power transmitter including a VLF antenna is much less than a typical transmitter having an antenna for higher frequency bands. The useful bandwidth of a typical transmitter including a VLF antenna is in the range of 25-100 Hz. The maximum data rate that can be transmitted by existing high power VLF transmitters is limited by the antenna system useful bandwidth of these transmitters.

One advantage of FSK and MSK is that the resulting RF signal has constant amplitude. Typical transmitter power levels for high power VLF transmitting stations are in the range of 100 kW to 2,000 kW. Therefore, high efficiency is a key requirement to minimize operational cost. Because the transmitted signal has a constant amplitude envelope it can be amplified by simple power amplifiers that operate in high efficiency modes, such as Class C or Class D. For this reason, all high power VLF transmitters utilize these types of high efficiency amplifiers and are incapable of handling any other type of modulation such as AM.

FIG. 1 is a block diagram of a typical prior art high power VLF transmitter employing MSK modulation. The transmitter of FIG. 1 is responsive to binary data source 910 having an output which supplies a bi-level, non-return to zero (NRZ) signal to MSK generator 912 which is responsive to VLF carrier source 916 and derives a frequency coded output, i.e., a variable frequency output dependent on the binary values of the output of source 910. In response to source 910 deriving binary one and zero values, generator 912 respectively derives first and second frequencies having the same AC amplitude at the carrier frequency and at 1.5 times the carrier frequency.

The MSK output of generator 912 is supplied to transmitter 914. Transmitter 914 includes a high power, high efficiency amplifier, such as a Class C vacuum tube amplifier including a tuned circuit having a resonant frequency equal to the VLF carrier frequency, or a Class D transistor amplifier including a low pass filter. Transmitter 914 also includes antenna impedance matching network 918, which is responsive to the output of the Class C or Class D amplifier, as appropriate.

If the data rate of source 910 is relatively low, no greater than 200 bits per second in the installations in Maine and Hawaii, network 918, in turn, supplies an MSK signal having an envelope with constant amplitude to high power VLF electromagnetic wave antenna system 920. Under such circumstances, antenna system 920, such as the previously described antenna systems in Maine and Hawaii, emits a VLF band wave with modulation having a substantially constant amplitude envelope with modulation having a wave shape that is a substantial replica of the wave shape derived by MSK generator 912.

The total frequency response of the cascaded sub-elements of the transmitter system of FIG. 1 can be found by taking the convolution of the impulse response of each of the sub-elements. In the block diagram of FIG. 1, antenna system 920 and matching network 918 cause the transmitter system of FIG. 1 to have an extremely narrow useful bandwidth. In the time domain, this narrow bandwidth causes errors in the transmitted waveform that increase rapidly with increasing data rate, particularly above 200 bits per second in the transmitters in Hawaii and Maine. The impulse responses of antenna system 920 and matching network 918 cause these errors in the time domain.

If the bit rate of source 910 is higher than a certain level, such as 200 bits per second, the components of transmitter 914, matching network 918, and particularly antenna 920 have frequency responses and group distortion (that is, an error in the relative time delay across the bandwidth of the antenna system 920 and the components between the antenna system and the output of generator 912) that change the shape of the frequency modulated wave which MSK generator 912 derives so that the shape of the modulation wave emitted by antenna system 920 is not a replica of the wave that generator 912 derives. Transmitter 914, matching network 918 and particularly antenna system 920 cannot accurately replicate the sidebands, especially the higher order sidebands, associated with accurate reproduction of the higher bit rate frequency modulated wave derived by MSK generator 912. (The reader will recall that a frequency modulated wave is theoretically represented by an infinite number of higher order terms having coefficients represented by Bessel functions.) Because the modulation wave emitted by antenna system 920 is not an accurate replica of the wave derived by generator 912, under these circumstances the signal at a receiver responsive to the wave emitted by antenna system 920 does not accurately replicate the output of binary data source 910.

Systems of the type illustrated in FIG. 1 have the disadvantages noted above relating to low data rate and are massive, highly expensive structures occupying enormous areas. In addition, considerable stresses are exerted on antenna system 920 in response to transients in the modulated wave the matching circuit supplies to the antenna system. For example, discharges sometimes occur across insulators of the antenna system, which insulators maintain components of the antenna system ungrounded.

It is, accordingly, an object of the present invention to provide a new and improved transmitting system, particularly adapted to operate in the VLF and/or low-frequency (LF; from 30 kHz to 300 kHz) ranges, wherein the transmitter has a relatively high rate of data transmission.

Another object of the invention is to provide a new and improved high power transmitting system, particularly adapted to operate in the VLF and/or LF band, wherein the system can employ an antenna system having reduced size and cost for a given data rate.

A further object of the invention is to provide a new and improved transmitting system, particularly adapted to operate in the VLF and/or LF range, wherein the transmitting system employs principles enabling it to be used in a large range of possible modulation types for various applications.

An additional object of the invention is to provide a new and improved high power transmitting system, which is particularly adapted to operate in the VLF and/or LF range, wherein the antenna system of the transmitter system has decreased voltage stresses, enabling the antenna system to radiate higher power.

An added object of the invention is to provide a new and improved high power transmitting system, which is particularly adapted to operate in the VLF and/or LF range, wherein changes in the antenna characteristics, due for example to weather and ground conductivity, are automatically compensated.

BRIEF SUMMARY

According to one aspect of the invention, a radio transmitter system arranged to be responsive to a binary signal and arranged for driving a narrow bandwidth electromagnetic wave antenna system comprises a generator responsive to the binary signal for deriving a first output signal having frequency coded values dependent on the values of binary bits of the binary signal. The frequency coded values represent the wave shape of the instantaneous amplitude of a first wave indicative of the values of binary bits of the binary signal. An arbitrary impulse response signal processor arrangement responds to the first output signal and has an output for deriving a second output signal having components representing the shape of a modulating wave having a variable amplitude envelope and the frequencies of the frequency coded values. A transmitter responsive to the second output signal and a carrier has an output for deriving a third output signal having modulation with a shape that is a substantial replica of the represented shape of the modulating wave. The third output signal is adapted to be supplied to the antenna system. Components of the antenna system and components between the output of the pre-corrector and the antenna system and the bit rate of the binary signal are such that they cause the signal emitted by the antenna system to include modulation having a shape that differs substantially from the shape of the first wave, but for the arbitrary impulse response signal processor arrangement The arbitrary impulse response signal processor arrangement is arranged so the signal emitted by the antenna system includes modulation having a shape that is substantially the same as the shape of the first wave.

Another aspect of the invention relates to a radio transmitter system arranged to be responsive to a binary signal and arranged for driving a narrow bandwidth electromagnetic wave antenna system, wherein the transmitter system comprises a generator responsive to the binary signal for deriving a first output signal having frequency coded values dependent on the values of binary bits of the binary signal. The frequency coded values represent the wave shape of the instantaneous amplitude of a first wave indicative of the values of binary bits of the binary signal. An arbitrary impulse response signal processor arrangement responsive to the first output signal has an output for deriving a second output signal having components representing the shape of a modulating wave having a variable amplitude envelope and the frequencies of the frequency coded values A transmitter responsive to the second output signal and a carrier has an output on which is derived a third output signal having modulation with a shape that is a substantial replica of the represented shape of the modulating wave. The third output signal is adapted to be supplied to the antenna system. The arbitrary impulse response signal processor arrangement includes a data processor arrangement having coefficients having values (a) based on impedance values of components between the output of the arbitrary impulse response signal processor arrangement and the antenna system and (b) impedance values of the antenna system.

The arbitrary impulse response signal processor arrangement preferably includes, in some embodiments, a finite impulse response filter including the coefficients. In another embodiment the signal processor arrangement includes an inverse Fourier transform arrangement having coefficients representing the inverse frequency responses of the antenna system and components between the arbitrary impulse response signal processor arrangement output and the antenna system.

An additional aspect of the invention relates to a radio transmitter system arranged to be responsive to a binary signal and arranged for driving a narrow bandwidth electromagnetic wave antenna system, wherein the transmitter system comprises: a generator responsive to the binary signal for deriving a first output signal having frequency coded values dependent upon the values of binary bits of the binary signal. The frequency coded values represent the wave shape of the instantaneous amplitude of a first wave indicative of the values of binary bits of the binary signal. An arbitrary impulse response signal processor arrangement responsive to the first output signal has an output for deriving a second output signal having components representing the shape of a modulating wave having a variable amplitude envelope and the frequencies of the frequency coded values. A transmitter responsive to the second output signal and a carrier derives a third output signal having modulation with a shape that is a substantial replica of the represented shape of the modulating wave. The third output signal is adapted to be supplied to the antenna system. The arbitrary impulse response signal processor arrangement includes a finite impulse response filter having coefficients having values based on the square of the differences between the shapes of the modulation emitted by the antenna system and the first wave.

Preferably, a detector arrangement effectively dynamically monitors the shape of the modulation emitted by the antenna system, and a processing arrangement responsive to the differences between the effectively monitored shape and the shape of the first wave modifies the values of the coefficients.

In all of the foregoing aspects of the invention the carrier frequency is preferably in the VLF or LF range.

An added aspect of the invention relates to a radio transmitter system responsive to a binary signal for driving an electromagnetic wave antenna system. The transmitter system comprises a signal processing arrangement responsive to the binary signal for deriving a frequency coded signal having frequency variations dependent on the value of binary bits of the binary signal and envelope amplitude variations. A transmitter responsive to the frequency coded signal and a carrier frequency derives a modulated output signal having modulation having an amplitude that is linearly proportional to the envelope amplitude variations and frequencies that deviate linearly from the carrier frequency by an amount that is linearly proportional to the frequency variations of the frequency coded signal. Circuitry supplies the modulated output signal to the antenna.

Preferably, the transmitter includes first and second processing channels responsive to the frequency coded signal. Each of the channels includes an amplitude comparator for deriving a comparator output having first and second values dependent on the value of the amplitude of the frequency coded signal relative to another value. A signal combiner has inputs resulting from the comparator outputs to derive the modulated output signal.

Another aspect of the invention relates to a method of transmitting, with a narrow bandwidth electromagnetic wave antenna system, an electromagnetic wave in response to a binary signal. The method comprises responding to the binary signal by deriving a first output signal having frequency coded values dependent upon the values of binary bits of the binary signal, wherein the frequency coded values represent the wave shape of the instantaneous amplitude of a first wave indicative of the values of binary bits of the binary signal. In response to the first output signal there is derived a second output signal having components representing the shape of a modulating wave having a variable amplitude envelope and the frequencies of the frequency coded values. Another output having values in accordance with amplitude values of a carrier frequency is derived. In response to the second output signal and another output there is derived a third output signal having modulation with a shape that is a substantial replica of the represented shape of the modulating wave. The third output signal is supplied to the antenna system. Components of the antenna system and components of elements between the second output signal and the antenna system and the bit rate of the binary signal are such that they cause the signal emitted by the antenna system to include modulation having a shape that differs substantially from the shape of the first wave, but for components of the second output signal. The components of the second output signal are such that the signal emitted by the antenna system includes modulation having a shape that is substantially the same as the shape of the first wave.

The above and still further objects, features and advantages of the present invention will become apparent upon consideration of the following detailed description of specific embodiments thereof, especially when taken in conjunction with the accompanying drawings.

DETAILED DESCRIPTION OF FIGS. 2-9

Figure 1:
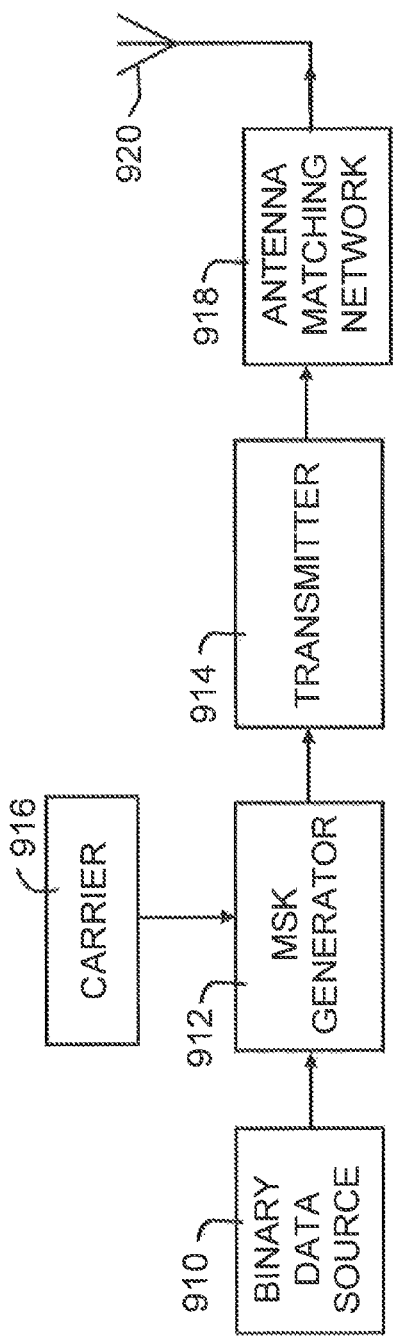
FIG. 1, as previously described, is a block diagram of a typical prior art high power VLF transmitter system.
Figure 2:
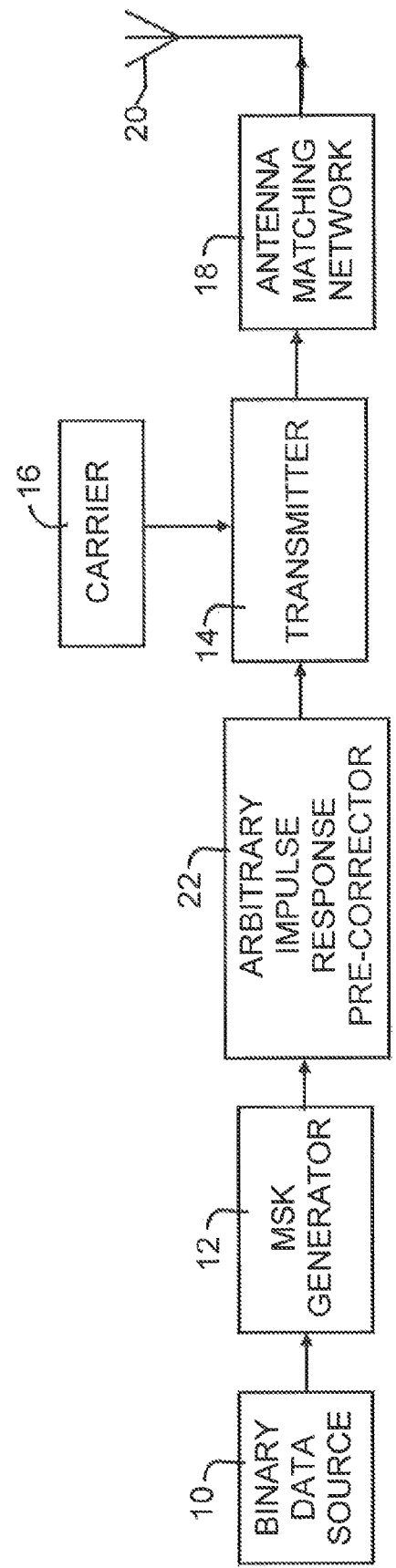
FIG. 2 is a block diagram of a high power VLF/LF transmitter system including an arbitrary impulse response pre-corrector.

FIG. 2 is a block diagram of a transmitter of the type illustrated in FIG. 1, but modified so the bit rate of binary data source 10 is increased over that of source 910 of FIG. 1; it is believed the bit rate of source 10 of FIG. 2 can be doubled over the bit rate of source 910 of FIG. 1, enabling the bit rate of source 10 to be as high as 400 bits per second. To achieve this and other favorable results and enable modulation emitted by electromagnetic wave antenna system 20 to have substantially the same wave shape as the frequency coded wave derived by MSK generator 12, so the wave emitted by the antenna system is accurately received by remote receivers, for example those on submarines, the transmitter system of FIG. 2 is modified (1) so (i) transmitter 14 differs from transmitter 914 and (ii) MSK generator 12 differs from MSK generator 912, and (2) to include a signal processor arrangement in the form of arbitrary impulse response pre-corrector 22 connected to be responsive to the frequency coded output of MSK generator 12.

MSK generator 12 differs from generator 912 because generator 12 derives a frequency coded signal at baseband instead of at an RF carrier frequency. Transmitter 14 is modified so it responds to the baseband output signal of pre-corrector 22 and the VLF or LF carrier of RF source 16 to derive a VLF or LF carrier with frequency and amplitude modulation; the modulation is an amplified replica of the shape of the input signal pre-corrector 22 supplies to transmitter 14.

Pre-corrector 22 supplies to transmitter 20 a baseband MSK frequency coded input signal having a variable amplitude envelope and frequency variations determined by the binary values of source 10; the variable amplitude and frequency variations are determined by the output of MSK generator 12. Pre-corrector 22 adjusts the amplitude of the envelope of the variable frequency output signal of MSK generator 12 so that the modulation in the signal emitted by antenna system 20 has substantially the same wave shape as the wave derived by MSK generator 12, even though antenna impedance matching network 18 and antenna system 20 of FIG. 2 have the same or similar narrow band width properties as the corresponding parts of the transmitter system of FIG. 1.

Transmitter 14 of FIG. 2, in one embodiment, includes a Class D transmitter, and has been modified, compared to transmitter 914 of FIG. 1, to include an amplifier having envelope elimination and restoration (EER), the principles of which are disclosed in Kahn, U.S. Pat. No. 2,989,707. In a second embodiment of the transmitter system of FIG. 2, transmitter 14 includes an amplifier having an amplitude modulator that forms two phase shifted pulse trains that are combined, as disclosed in Hanna, U.S. Pat. No. 4,540,957. In both embodiments, the amplifier derives a signal having modulation having amplitudes that are linearly proportional to envelope amplitude variations at the output of pre-corrector 22 and frequencies that deviate linearly from the carrier frequency by an amount that is linearly proportional to the frequency variations of the frequency coded output signal of generator 12.

If transmitter 14 of FIG. 2 includes EER principles as disclosed by Kahn, the output signal of pre-corrector 22, including amplitude and phase components (indicated by real and imaginary components of the output of the pre-corrector), is applied to an I-Q modulator arrangement of transmitter 14. The modulator arrangement derives a signal that is MSK frequency coded and has a variable amplitude envelope impressed on the frequency of the sinusoidal carrier of source 16. Transmitter 14 separates the complex MSK frequency coded signal into its amplitude and phase components, amplifies each separately and then combines the amplified components in a final high power RF stage, by effectively multiplying them together, to efficiently achieve the required linear amplification of both phase modulation and envelope amplitude of the output of pre-corrector 22.

If transmitter 14 of FIG. 2 includes an amplifier based on the Hanna principles, the complex (real and imaginary) components of the output signal of pre-corrector 22 are applied to a signal processor arrangement that determines the real and imaginary components of the pre-corrector output relative to the absolute value (that is, the magnitude of the vector sum of the real and imaginary components; the square root of the sum of the squares of the real and imaginary components) of the pre-corrector output signal. The values of the real and imaginary components relative to the absolute value of the pre-corrector output are applied to an I-Q modulator in which they are respectively multiplied with orthogonal sinusoidal components of the carrier frequency, as produced by carrier source 16, to derive product signals that are added together to form variable AC amplitude and variable frequency components that are modulated on the carrier of source 16.

The I-Q modulator output (that is, the sum of the product signals) is applied in parallel to first complementary inputs of first and second comparators, having second complementary inputs responsive to a signal indicative of the absolute value of the pre-corrector output. The first and second comparators derive bi-level outputs that change value each time the relative polarities of the inputs thereof change. The bi-level outputs of the first and second comparators are applied to first and second processing channels responsive to rectangular waves at the frequency of the sum of the product signals. The rectangular waves have 25% duty cycles and differing phases.

Each processing channel derives a high power, bi-level, pulse width modulated wave, having a duty cycle dependent on the relative instantaneous amplitudes of the output of pre-corrector 22 and the carrier derived by source 16. The bi-level, pulse width modulated outputs are passed through low pass filters which pass the carrier frequency and higher order side bands of the bi-level pulse width modulated outputs associated with variable frequency components in the output of pre-corrector 22. The filters block harmonics of the carrier frequency to derive two sinusoidal waves having variable amplitude envelopes (dependent on the amplitude variations introduced by pre-corrector 22) and variable frequencies that deviate from the carrier frequency by amounts linearly proportional to the MSK modulation frequencies. The two sinusoidal waves are added together to form the sum thereof to provide a signal having envelope amplitude variations linearly proportional to the amplitude variations at the output of pre-corrector 22 and frequency variations from the carrier frequency that are linearly proportional to the frequency variations of the output MSK generator 12. It is understood that the sequential process of filtering followed by summation can be reversed. Therefore, performing the summation prior to filtering will obtain the same result.

Pre-corrector 22 is a signal processor arrangement arranged to store arbitrary weighting coeffients that correspond to a carefully chosen impulse response of the components of antenna system 20, matching network 18 and transmitter 14 of FIG. 2. Thereby, pre-corrector 22 provides an arbitrary impulse response in the system shown in FIG. 2.

To transmit the MSK data of source 10 without errors so the modulation emitted by antenna system 20 has a wave shape that is a substantial replica of the wave shape which generator 12 derives, despite the narrow useful bandwidth of antenna system 20, the overall impulse response of the transmitter of FIG. 2 is as close to a unit impulse as possible. The impulse response of pre-corrector 22 is such that the pre-corrector enables the transmitter system of FIG. 2 to have an overall impulse response that is sufficiently close to a unit impulse. Therefore, the useful bandwidth of antenna system 20, which, as discussed supra, is quite narrow (e.g., 25-100 Hz), is no longer a significant limitation on the overall response of the transmitter system of FIG. 2 and it is theoretically possible to increase the data rate of source 10 as high as desired.

To obtain the required arbitrary impulse response of pre-corrector 22 that results in the desired overall impulse response of the transmitter system of FIG. 2, the pre-corrector, in one embodiment, includes a finite impulse response filter (FIR) loaded with computed values corresponding to the combined inverse frequency response of each element of the overall system downstream of the pre-corrector, i.e., between the output of pre-corrector 22 and the output of antenna system 20. The inverse frequency responses are calculated from a measured or calculated frequency response of each of these elements.

In another embodiment, pre-corrector 22 determines the arbitrary impulse response by using a Least Mean Square (LMS) arrangement to estimate the impulse response of the overall transmitter system of FIG. 2 and derive the required arbitrary impulse response. The LMS arrangement enables the unknown coefficients (also known as the impulse response) of pre-corrector 22 to be determined. One begins by making an initial estimate of the coefficients and loading them into the FIR filter of pre-corrector 22. With the transmitter system of FIG. 2 running normally, the LMS arrangement computes the difference, that is, error, between the output of the transmitter system of FIG. 2 and the theoretically perfect output of the transmitter system. By applying a simple formula using this error value a new set of coefficients for the FIR filter is created; the values of the coefficients of the new set usually differ slightly from the previous coefficient values. These new coefficients are then loaded into the FIR filter and the LMS arrangement of pre-corrector 22, causing a new calculation for the FIR filter coefficients to be performed. The operations repeat and after a large number of iterations the coefficients converge to the correct values that significantly reduce the error, to make the output of the transmitter system, at antenna system 20 match, as close as possible, the ideal signal to be transmitted from the transmitter system.

Pre-corrector 22 can also determine the arbitrary impulse response by using an arrangement for determining the inverse frequency response of the transmitter system of FIG. 2. To this end, the impedance of every element of the transmitter system between pre-corrector 22 and the output of antenna system 20 is determined and the inverse frequency response thereof is calculated. The inverse frequency responses are converted into a corresponding time domain impulse response using an inverse fast Fourier transform (IFFT) arrangement. The result is the impulse response, that is, coefficients, needed for the FIR filter of pre-corrector 22.

Whatever arrangements are employed to obtain the arbitrary impulse response and to determine the coefficients, the arrangements should not affect the overall result so long as the chosen arrangement correctly determines the required impulse response of pre-corrector 22 that causes the transmitter system of FIG. 2 to have an impulse response sufficiently close to a unit impulse.

By examining the required impulse response of pre-corrector 22, it is possible to determine the required voltage and current handling capability of transmitter 14, antenna matching network 18, and antenna system 20. Transmitter 14 has sufficient output power and the power ratings of components of antenna matching network 18 are such that the data rate of source 10 of the transmitter system of FIG. 2 is considerably greater than that of source 910 of the transmitter system of FIG. 1. By selecting transmitter 14 so it has sufficient output power and the components of antenna matching network 18 with sufficient power ratings, the data rate of source 10 can be increased arbitrarily and be limited only by the current and voltage ratings of the components of transmitter 14, network 18 and antenna system 20.

Inclusion of pre-corrector 22 does not impose any additional stress on antenna system 20. In fact, pre-corrector 22 reduces stresses on antenna system 20. This is because the constant amplitude transmitter system of FIG. 1 produces transient impulses on the antenna as a result of frequency shifts in the modulated wave that transmitter 914 and matching network 918 of FIG. 1 apply to antenna system 920. Pre-corrector 22 enables these transients to be reduced significantly. Detection of the voltage and current transients within antenna system 20 during frequency shifts provides a convenient way of determining whether or not pre-corrector 22 has been loaded with the correct coefficients (i.e. has the optimal impulse response). As the overall system impulse response approaches sufficiently close to a unit impulse response, the voltage and current transients in antenna system 20 are minimized. Therefore, a further benefit of the inclusion of pre-corrector 22 is an increase in radiated power resulting from reduction of electrical voltage stresses within antenna system 20.

Even though the MSK signal from MSK generator 12 has constant AC amplitude, the output of arbitrary impulse response pre-corrector 22 typically has variable AC amplitude, that is, a variable amplitude envelope, and a variable frequency determined by the frequency of the output signal of MSK generator 12. Therefore, transmitter 14 must be able to linearly amplify a signal having (1) phase or frequency variations, and (2) AC amplitude variations. As the data rate of source 10 increases and the bandwidth of antenna system 20 decreases, the AC amplitude variations demanded of transmitter 14 increase. Therefore, the maximum power range of the output signal of transmitter 14 is an important factor in determining the maximum data rate of source 10. This is advantageous because it enables there to be a tradeoff between transmitter output power and antenna system size. The size, cost and land area required for antenna system 20 of FIG. 2 are significantly reduced compared to antenna system 920 of FIG. 1 in exchange for an increase in the voltage and current handling capabilities of transmitter 14 of FIG. 2. An analysis of practical antenna systems 20 and 920, and of transmitters 14 and 914 shows that the typical prior art VLF transmitter system that is modified to include pre-corrector 22 can double its raw MSK data rate with a reasonable increase in voltage and current handling capability of transmitter 14 as a result of transmitter 14 linearly amplifying the time varying AC amplitude and phase output of pre-corrector 22.

Even though the output voltage and current of transmitter 14 of the system of FIG. 2 increase compared to those of the system of transmitter 914 FIG. 1, the total power output of the transmitter system of FIG. 2 remains the same as that of the transmitter system of FIG. 1 for a given antenna system 20. For this reason transmitter 14 of FIG. 2 includes a high efficiency power amplifier (such as a tetrode high power vacuum tube or a Class D power amplifier) for amplifying the variable AC amplitude signal produced by arbitrary impulse response pre-corrector 22. As a result, the transmitter system of FIG. 2 requires little or no increase in power consumption over the transmitter system of FIG. 1 to achieve an increase in data rate over the transmitter system of FIG. 1.

Transmitter 14 of FIG. 2 can include various devices for linearly amplifying the time varying AC amplitude and phase of the RF signal that pre-corrector 22 derives in addition to devices including the EER principles disclosed by Kahn, U.S. Pat. No. 2,989,707 and the device disclosed by Hanna, U.S. Pat. No. 4,540,957.

If transmitter 14 of FIG. 2 includes EER, the complex MSK signal derived by pre-corrector 22 is separated into its amplitude and phase components. Each component is amplified separately and the amplified components are combined in a final high power RF stage to efficiently achieve the required linear amplification of both phase and amplitude. Regardless of the arrangement which is employed, that arrangement should not affect the overall result. Because transmitter 14 of FIG. 2 linearly amplifies the time varying AC amplitude and time varying phase of the baseband signal that pre-corrector 22 derives, the transmitter system of FIG. 2 works effectively for types of modulation other than MSK. The transmitter system of FIG. 2 does not require any prior knowledge of the type of modulation employed. It only relies on pre-corrector 22 to achieve an overall impulse response sufficiently close to a unit impulse response. This is an optimal condition for any modulation type.

The transmitter system of FIG. 2 can effectively handle modulation types other than MSK, such as Gaussian minimum shift key (GMSK), coded orthogonal frequency division multiplexing (COFDM) and code division multiple access (CDMA). The benefits of the transmitter system of FIG. 2 are realized no matter what modulation format is selected. This is a significant benefit of the transmitter system of FIG. 2 because it frees the system designer from limitations imposed by the constant amplitude requirement of many currently deployed systems. The transmitter system of FIG. 2 is thus capable of amplifying RF signals having time varying AC amplitude, such as COFDM and CDMA, and is able to perform its amplification function while preserving the highest possible efficiency for the reasons already mentioned.

Figure 3:
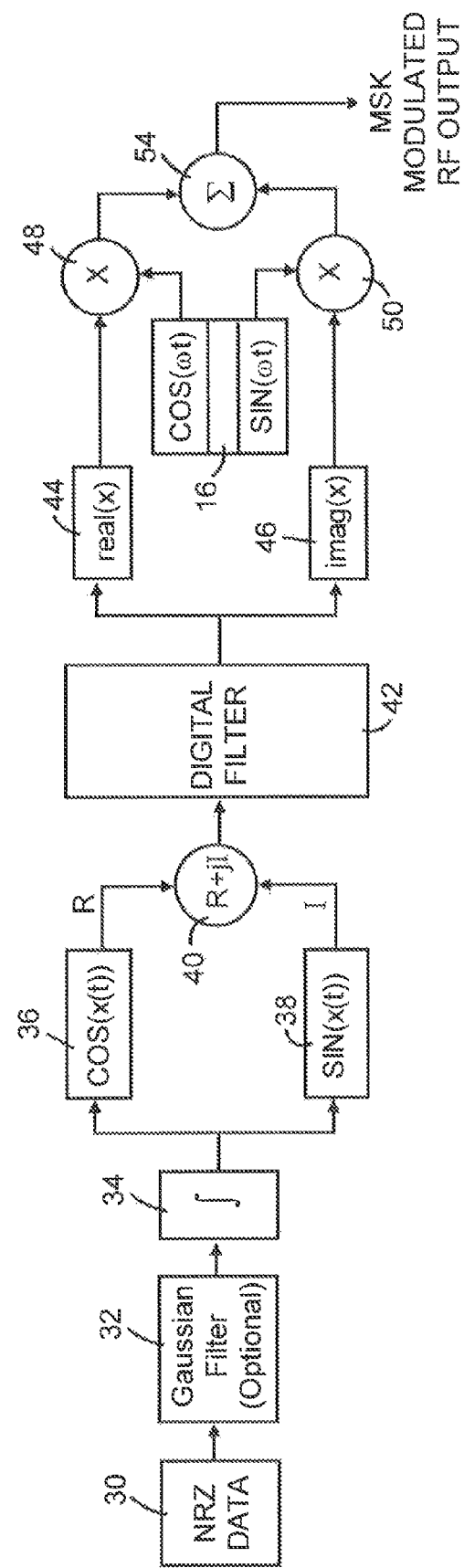
FIG. 3 is a more detailed block diagram of a portion of a first embodiment of the high power VLF transmitter system illustrated in FIG. 2.

Reference is now made to FIG. 3, a more detailed block diagram of portions of the transmitter system of FIG. 2. The system of FIG. 3 is responsive to NRZ binary data source 30, having for example a data rate of 400 bits per second. The output of data source 30 is applied to Gaussian filter 32, which is not necessarily employed, but causes the transmitter of FIG. 3 to provide GMSK modulation. The output of filter 32 drives integrator 34, which functions as a low pass filter to smooth sudden transitions in the outputs of source 30 and filter 32. Filter 34 has an output x(t) that is applied in parallel to cosine and sine function generators 36 and 38 which respectively derive signals representing the instantaneous values of the complex, (that is, real and imaginary) components (R and I) of x(t). The outputs of function generators 36 and 38 are supplied to combiner 40, which derives an output signal representing the complex quantity cos(x(t)+jsin(x(t), where j=square root of minus one. The output of combiner 40 is a baseband signal representing a frequency coded wave having constant AC amplitude, wherein the frequencies of the wave represent the binary values of bits of NRZ source 30; thus the output of combiner 40 is a baseband MSK signal similar to the output of MSK generator 912, but does not include a carrier frequency.

The complex, baseband output signal of combiner 40 is applied to digital filter 42, such as a FIR filter, which functions as the arbitrary impulse response pre-corrector 22 of FIG. 2. Filter 42 is loaded with coefficients $B_i \ldots B_1$, having values determined by the impedances of components of the transmitter system between the outputs of filter 42 and antenna system 20, including the impedances of the antenna system. The number of coefficients ($B_i$) depends on the desired accuracy of the shape of the modulation wave in the signal emitted from antenna system 20 relative to the shape of the output of generator 12, as derived from combiner 40; an exemplary number of coefficients is 256.

The output of filter 42 includes real and imaginary components. In the EER embodiment, the output of filter 42 is applied to an I-Q modulator of transmitter 14. The modulator includes parallel real and imaginary component detectors 44 and 46, driven in parallel by the output of filter 42. Detectors 44 and 46 respectively have outputs applied to signal multipliers 48 and 50. Multipliers 48 and 50 are driven orthogonally by $\cos(w_c t)$ and $-\sin(w_c t)$ sinusoidal outputs of carrier frequency source or oscillator 16; where $w_c$=the angular carrier frequency; the carrier frequency is at the center of the useful bandwidth of VLF or LF antenna system 20. The resulting product signals that multipliers 48 and 50 derive are linearly combined in summing device 54, which derives a GMSK modulated RF output signal having a mean angular carrier frequency equal to $w_c$ and positive and negative sidebands containing the same wave shapes as the output signal of filter 42. The sidebands in the output signal of summing device 54 have (1) variable AC amplitude (i.e., variable amplitude envelope) variations due to operations performed by filter 42 and (2) phase/frequency variations due to the bit values of source 30.

Figure 4:
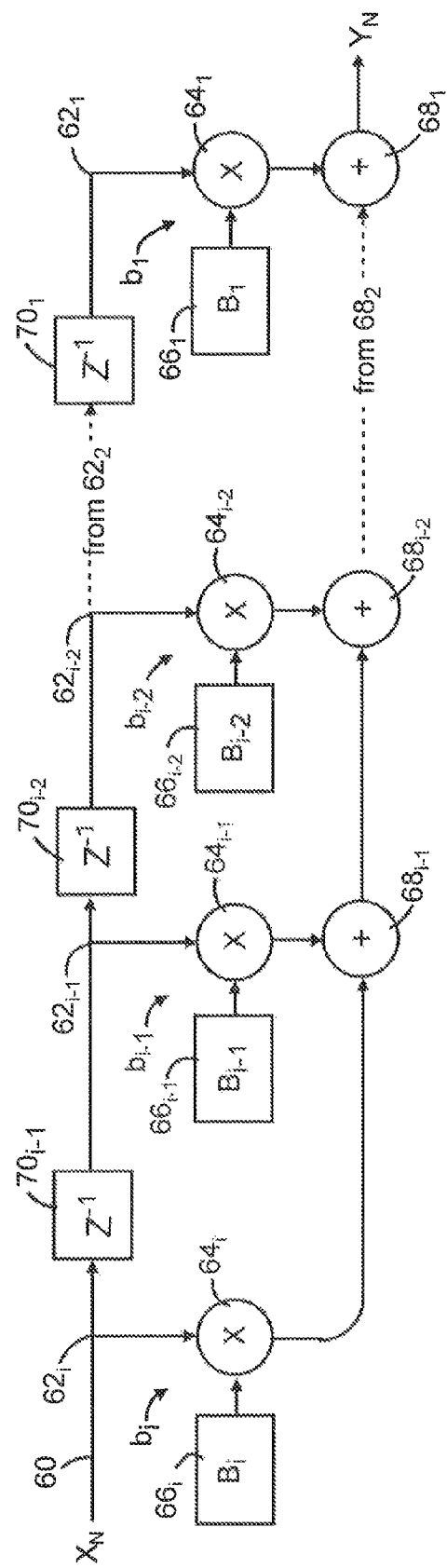
FIG. 4 is a block diagram of a signal processor arrangement in the form of a finite impulse response (FIR) filter that can be used in the arbitrary impulse response pre-corrector of the transmitter system of FIG. 2.

Reference is now made to FIG. 4 of the drawing, a block diagram of a preferred embodiment of digital filter 42, in the form of a FIR filter. The FIR filter of FIG. 4 includes an input line 60 responsive to the sum of the baseband real and imaginary components at the output of combiner 40. If necessary, the output of combiner 40 is applied to an analog to digital converter prior to being applied to input line 60. (While discrete components are illustrated in FIGS. 3-7 and 9 for convenience and ease of explanation, it is to be understood that many or all of the operations performed by these discrete components, except those related to power amplification and power handling, can be and are preferably performed numerically, in a computer.) The FIR filter of FIG. 4 includes $b_i$ cascade stages $b_1 \ldots b_i$, respectively responsive to stored coefficients $B_1 \ldots B_i$ which can be determined as previously described. In one preferred embodiment there are 256 cascaded stages $b_1 \ldots b_i$: for ease of explanation, FIG. 4 includes only stages $b_i \ldots b_{i-2}, b_{i-1}, b_i$.

Stage $b_i$ includes input terminal $62_i$, which supplies the complex signal, at the output of combiner 40, on input line 60, to multiplier $64_i$, which is also responsive to coefficient $B_i$, as derived from source $66_i$. The resulting product signal, representing a complex quantity including real and imaginary components, is applied to one input of summing device $68_{i-1}$ of stage $b_{i-1}$. Stage $b_{i-1}$ includes input terminal $62_{i-1}$, responsive to a delayed replica of the signal at terminal $62_i$, as derived by delay element $70_i$. The signal at terminal $62_{i-1}$ is applied in parallel to delay element $70_{i-1}$ and multiplier $64_{i-1}$, which is also responsive to coefficient $B_{i-1}$ as derived from source $66_{i-1}$. The complex output of multiplier $64_{i-1}$ is linearly combined in summing device $68_{i-1}$ with the output of multiplier $64_i$. The output of summing device $68_{i-1}$ is applied to a similar summing device $68_{i-2}$ of the next cascaded stage $b_{i-2}$ which is constructed identically to stage $b_{i-1}$ and includes an input signal terminal $62_{b-2}$ responsive to a delayed replica of the signal at terminal $62_{i-1}$, as derived by delay element $70_{i-1}$, which introduces the same delay as is introduced by delay element $70_i$. The remaining cascaded stages are identical to stage $b_{i-1}$, so that the last stage $b_1$ includes input terminal $62_1$, multiplier $64_1$, coefficient source $66_1$ for coefficient $B_1$ and summing device $68_1$ on which is derived the complex output of FIR filter 42, typically including non-zero real and imaginary components. The output of summing device $68_1$ is applied to detectors 44 and 46 in the EER embodiment.

Figure 5:
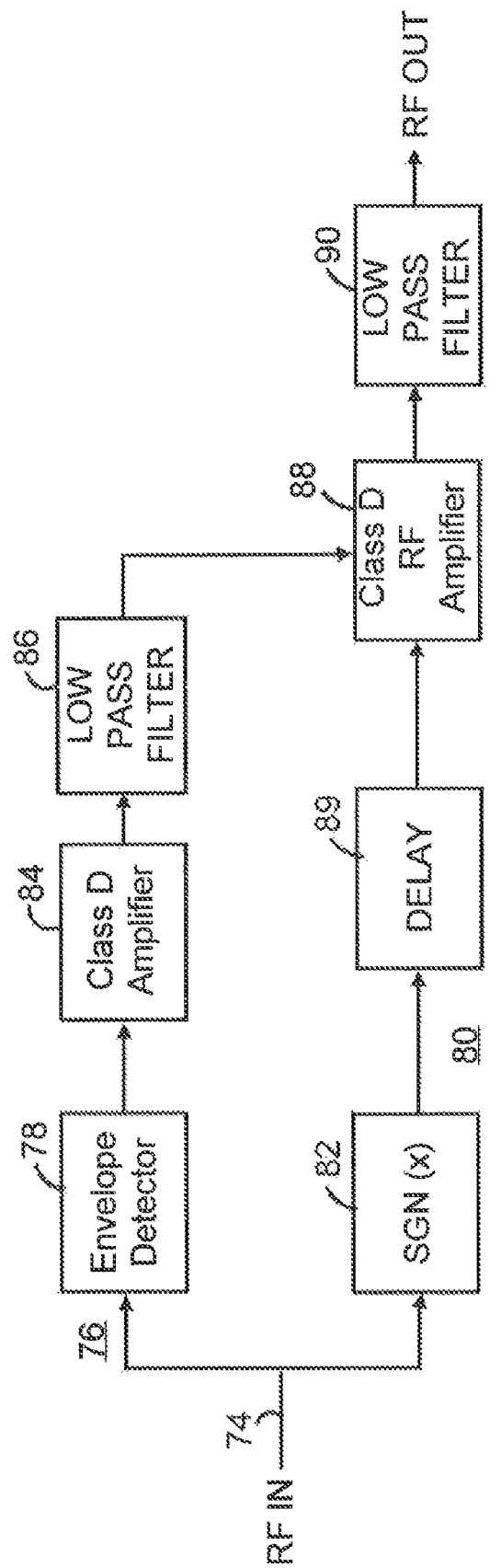
FIG. 5 is a block diagram of some portions of the first embodiment of the transmitter system of FIG. 2.

Reference is now made to FIG. 5, a block diagram of a portion of a transmitter included in the EER embodiment of transmitter 14 in the transmitting system of FIG. 2. The transmitter portion illustrated in FIG. 5 responds to the portion of the transmitter illustrated in FIG. 3 and includes an RF input lead 74 responsive to the RF modulated output signal of summing device 54, FIG. 3. The RF signal on lead 74 is applied in parallel to a first branch 76 including envelope detector 78 and to a second branch 80 including polarity (that is, SGN(x)) detector 82. Polarity detector 82 is a zero crossing detector, so that detector 82 derives a tri-level signal having plus and minus predetermined equal values in response to the input signal (x) to the detector respectively having positive and negative values and a zero value in response to (x) being equal to zero. Thus, detector 82 compares the amplitude modulated RF output of summing device 54 with a zero value and derives (1) positive and negative outputs having the same amplitude in response to the output of summing device 54 being respectively positive and negative and (2) a zero output in response to the output of summing device 54 being zero. Thus, detector 82 is effectively a comparator arranged to compare the output of summation device 54 with zero so that the comparator derives first and second opposite polarity levels of the same amplitude in response to the amplitude of the output of device 54 being respectively above and below zero. Accordingly, the output of detector 82 is a square wave having the same frequency and phase as the variable amplitude RF output of summing device 54.

Envelope detector 78 derives a unipolar output signal having amplitude variations corresponding with variations in the magnitude of the AC output of summing device 54, FIG. 3 (i.e., variations in the amplitude of the envelope of the output of device 54). The output signal of amplitude detector 78 is applied to one input of a comparator of Class D amplifier 84;

the other input of the comparator of amplifier 84 is a periodic, sloping wave, preferably with a triangular shape (although a sine wave can be employed with slightly inferior results) having a frequency much greater than the highest frequency derived by envelope detector 78. The output of the comparator of amplifier 84 is applied to a transistorized switching arrangement which derives a bi-level output signal having positive and negative values. The bi-level output signal of amplifier 84 is applied to low pass filter 86, having a cutoff frequency that passes the output frequencies of detector 78 but blocks the frequency of the triangular wave and all harmonics thereof, so that the signal at the output of low pass filter 86 is an efficiently generated power amplified replica of the output of envelope detector 78.

The outputs of detector 82 and low pass filter 86 are applied to the inputs of the comparator of Class D RF power amplifier 88; the output of detector 82 is applied to amplifier 88 after passing through delay element 89, having a delay time equal to the group delay of detector 78, amplifier 84 and filter 86 so that the inputs to amplifier 88 are based on simultaneous instantaneous values of the signal on lead 74. Amplifier 88 has a high power output that is applied to low pass filter 90, having a cutoff frequency that passes the fundamental frequency of carrier source 16 and all frequencies less than this fundamental frequency, as well as side bands associated with the phase and frequency variations of the output of FIR filter 42, that is, the output of pre-corrector 22. The cutoff frequency of filter 90 is such that the filter blocks the periodic, sloping wave input of the comparator of amplifier 84 and harmonics thereof. Amplifier 88 responds to the output of detector 82 so that the detector output, which can be considered as the RF phase modulated signal, effectively amplitude modulates the output of low pass filter 86. The output of filter 86 represents the AC variations resulting from the operations performed by FIR filter 42. Thus, amplifier 88 effectively multiples the plus one and minus one levels of the square wave output of detector 82, having transitions corresponding with the zero crossings of the frequency modulation of the RF output of summing device 54, by the output of low pass filter 86, representing the amplitude variations of the signal derived by summing device 54. The output of filter 90 is a high power signal having an angular carrier frequency $w_c$ and a side band modulation wave having the same shape as the shape of the wave represented by the output of FIR filter 42.

Figure 8:
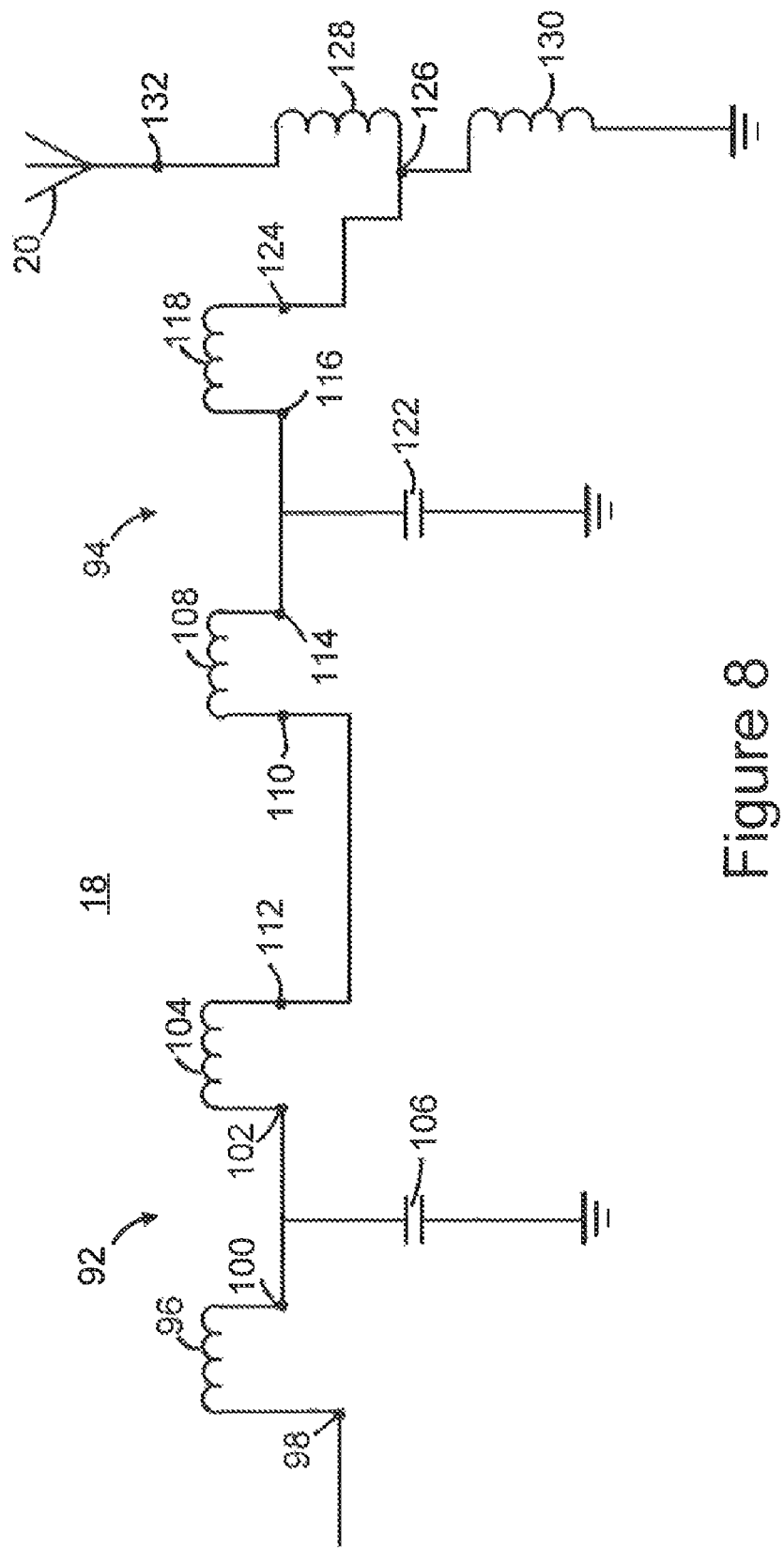
FIG. 8 is a circuit diagram of an impedance matching network that can be employed in the first and second embodiments of the transmitter system of FIG. 2.

The output signal of low pass filter 90 is applied to the input of impedance matching network 18, preferably configured as illustrated in FIG. 8, for use in conjunction with the transistorized amplifiers 84 and 88 of FIG. 5 and a typical prior art VLF antenna system 20. Amplifiers 84 and 88 are voltage sources. As such, it is necessary for matching network 18 to introduce an odd multiple of 90°, at the frequency of carrier source 16, between the voltage output of low pass filter 90 and the current in the radiating element of antenna system 20; typically, the odd multiple is 270°. The use of 90° is frequently not practical because the distance between transmitter 14 and antenna system 20 frequently approaches or exceeds 90° at the VLF or LF frequency of carrier source 16. The phase shift of impedance matching network 18 provides the correct phase shift between the output voltage of low pass filter 90 and the current applied to antenna system 20 to enable the frequency response of the transmitter to be symmetrical across the useful bandwidth of the transmitter system. Providing the proper phase shift in impedance matching network 18 and low pass filters 86 and 90 so such symmetry is achieved reduces the maximum voltage and current stresses within amplifier 88, low pass filter 90 and matching network 18.

Figure 6:
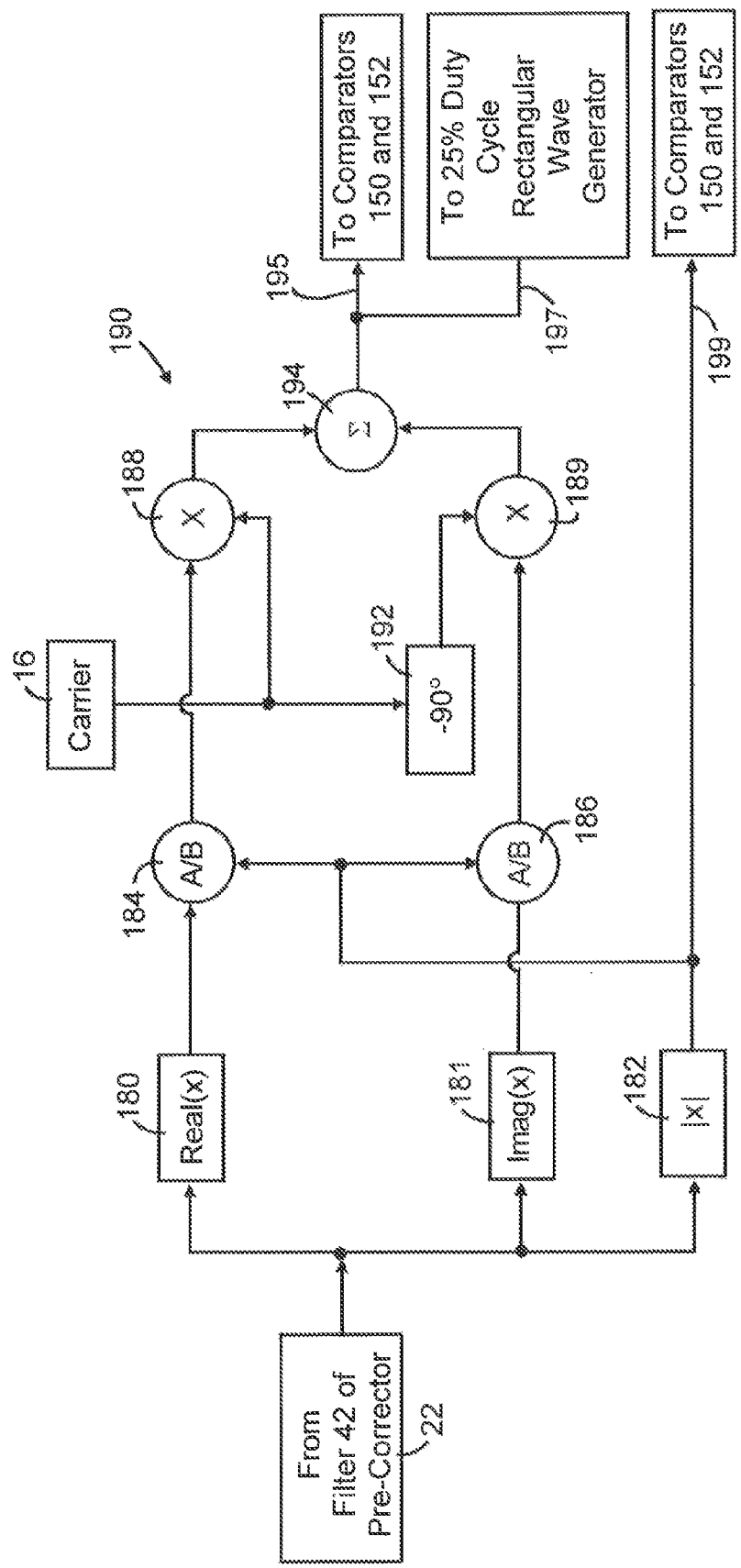
FIGS. 6 and 7 are block diagrams of some portions of a second embodiment of the transmitter of FIG. 2.
Figure 7:
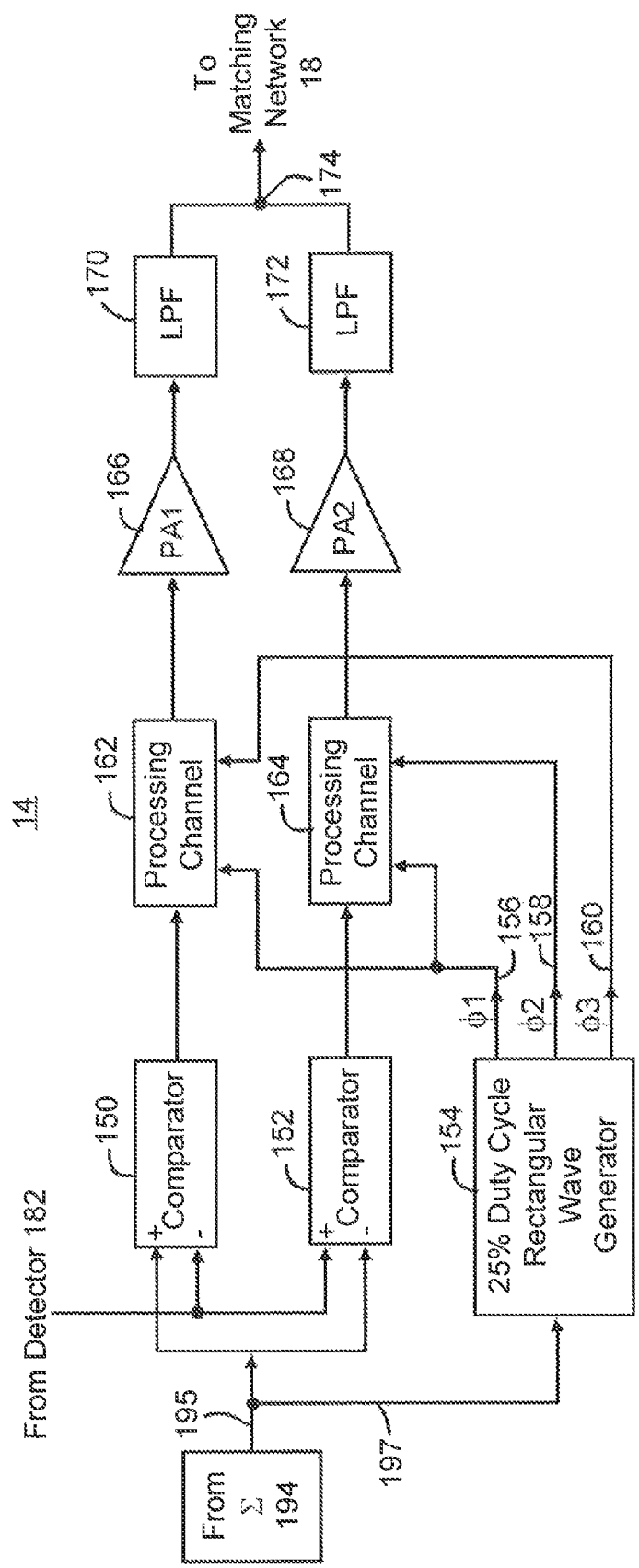

If the amplitude modulator disclosed by Hanna is employed in transmitter 14, the baseband output signal of filter 42 (FIG. 3) of pre-corrector 22 is applied to the signal processing elements illustrated in FIG. 6. The complex output signal (x) of filter 42 (including real and imaginary baseband components) is applied in parallel to detectors 180, 181 and 182 that respectively derive output signals indicative of the instantaneous values of the real and imaginary components of the output (real(x) and imag(x)) of pre-corrector 22 and the magnitude of the output of the pre-corrector (that is, the vector sum of the real and imaginary components). The output signals of detectors 180 and 181 are applied to numerator inputs of arithmetic dividers 184 and 186, respectively, while the output signal of detector 182 is applied in parallel to divisor inputs of dividers 184 and 186. Dividers 184 and 186 derive quotient representing output signals respectively indicative of the percentage or fraction of the instantaneous real and imaginary components of the output of pre-corrector 22 relative to the instantaneous value of total magnitude of the output of the pre-corrector.

The quotient representing variable AC amplitude and variable frequency baseband output signals of dividers 184 and 186 are respectively applied to one input of multipliers 188 and 189 of I-Q modulator 190 to amplitude modulate the VLF or LF carrier of source 16. The other inputs of multipliers 188 and 189 are respectively responsive directly to the output of source 16 and to the output of source 16, as coupled through −90° phase shifter 192. The resulting product output signals of multipliers 188 and 189 are linearly combined in summing device 194, which derives an RF output signal having a VLF or LF carrier frequency at the frequency of source 16, as well as upper and lower sidebands containing amplitude modulation having the same wave shape as the baseband output of filter 42 of pre-corrector 22. Hence, the sidebands at the output of summing device 194 include a variable amplitude envelope having frequency variations relative to the carrier frequency of source 16 determined by the values of the binary bits of source 30. The output signals of summing device 194 and detector 182 are respectively applied via leads 195, 193 and 199 to the remainder of the Hanna transmitter illustrated in FIG. 7.

The RF output signal of summing device 194 on lead 195 is applied in parallel to complementary inputs of comparators 150 and 152 (FIG. 7) so that the plus and minus inputs of comparators 150 and 152 are respectively responsive to the RF output of summing device 194. The baseband output of detector 182, indicative of the instantaneous magnitude of the output of filter 42 of pre-corrector 22, is applied in parallel to complementary inputs of comparators 150 and 152 so that the minus and plus inputs of comparators 150 and 152 are respectively responsive to the output of detector 182. Comparators 150 and 152 derive bi-level outputs that change value each time the relative values of the inputs thereof change polarity, so that, e.g., the output of comparator 150 changes from a first level to a second level when the amplitude of the RF output of summation device 194 goes from being less than the amplitude of the baseband output of detector 182 to being greater than the amplitude of detector 182, and vice versa. Similarly, but in an opposite manner, the output of comparator 150 changes from the second level to the first level when the amplitude of the RF output of summation device 194 goes from being greater than the amplitude of the baseband output of detector 182 to being less than the amplitude of detector 182, and vice versa. Such changes typically occur twice during every cycle of the RF frequency of carrier source 16 because of the much higher frequency of the carrier (that is included in the RF output of summing device 194) than the baseband output signal of detector 182.

The sinusoidal RF output of summation device 194 which includes the carrier frequency of source 16 is applied via lead 197 to rectangular wave generator 154 which derives, on leads 156, 158 and 160, three rectangular bi-level waves, each having (1) the same frequency as source 16, (2) a 25% duty cycle (i.e., a non-zero value 25% of the time), and (3) a different phase. The waves on leads 156 and 158 are complementary, while the wave on lead 160 has a non-zero value half way between the non-zero values of waves on leads 156 and 158.

The waves on leads 156, 158 and 160 are applied to processing channels 162 and 164, respectively responsive to the bi-level outputs of comparators 150 and 152. Channels 162 and 164 include logic circuitry, details of which are disclosed in the aforementioned Hanna patent and need not be disclosed in detail herein, other than to state the wave on lead 156 is applied in parallel to channels 162 and 164, the wave on lead 158 is applied to channel 164, and the wave on lead 160 is applied to channel 162. Channels 162 and 164 respond to the inputs thereof to derive first and second low power pulse width modulated bi-level outputs, having transitions determined by the occurrence times of crossovers of the inputs of comparators 150 and 152, respectively. Hence, e.g., the output of channel 162 switches from a first level to a second level in response to the instantaneous amplitude of the sinusoidal RF carrier frequency at the output of summation device 194 on lead 197 changing from being less than the absolute value of the instantaneous amplitude of the of output of pre-corrector 22 to being greater than the output of the pre-corrector, and vice versa. Similarly, the output of channel 164 switches from the first level to the second level in response to the instantaneous amplitude of the sinusoidal RF carrier frequency at the output of summation device 194 on lead 197 changing from being greater than the absolute value of the instantaneous amplitude of the of output of pre-corrector 22 to being less than the output of the pre-corrector, and vice versa.

The pulse width modulated bi-level output signals of channels 162 and 164 (that have the same two amplitude levels) are applied to power amplifiers 166 and 168, respectively. Each of amplifiers 166 and 168 includes either a high power tetrode vacuum tube or many MOSFET devices connected in parallel. Amplifiers 166 and 168 respectively derive high power bi-level replicas of the low level outputs of channels 162 and 164.

The high power outputs of amplifiers 166 and 168 are respectively applied to low pass filters 170 and 172, having the same cutoff frequency that passes (1) the carrier frequency of source 16 and (2) a sufficient number of side bands associated with the first and second low power pulse width modulated bi-level outputs of channels 162 and 164, which are in turn associated with the frequency variations of generator 12. The cutoff frequency of filters 170 and 172 is such that the filter blocks all harmonics of the carrier frequency.

The output signals of filters 166 and 168 are sinusoidal RF waves having equal instantaneous AC amplitude variations (i.e., envelope variations) determined by the duty cycles of the pulse width modulated output signals of channels 162 and 164, in turn determined by the baseband amplitude variations at the output of pre-corrector 22, as detected by detector 182. The output signals of filters 170 and 172 differ in phase from each other by an amount that is directly proportional to the frequency variations of combiner 40 of GMSK generator 12. The sinusoidal outputs of low pass filters 170 and 172 are applied to summing node 174 that forms the sum of the outputs of filters 170 and 172. Node 174 derives a high power, sinusoidal wave having AC amplitude that is linearly proportional to the amplitude of the output of pre-corrector 22 and has a frequency that deviates from the frequency of carrier source 16 by an amount that is linearly proportional to the frequency of the GMSK output of generator 14. Thus, the output of node 174 is an RF signal having modulation having the same shape as the shape of the baseband output of filter 42 and a VLF or LF carrier frequency equal to the frequency of source 16. The output of node 174 is applied to the input of impedance matching network 18.

Impedance matching network 18, as illustrated in FIG. 8, includes two cascaded T sections 92 and 94. Each of sections 92 and 94 includes a pair of series connected inductors, between which is connected a shunt capacitor. In particular, section 92 includes series connected inductor 96, having a first terminal 98 connected to the output of low pass filter 90 or node 170 and a second terminal 100 connected to terminal 102 of series connected inductor 104. Terminals 100 and 102 are connected to one electrode of capacitor 106, the other electrode of which is grounded. Section 94 includes series connected inductor 108 having a first terminal 110 connected to terminal 112 of inductor 104. Inductor 108 has a second terminal 114 connected to terminal 116 of series connected inductor 118. Terminals 114 and 116 are connected to one electrode of capacitor 122, having a grounded second electrode. Terminal 124 of inductor 118 is connected to tap 126 between inductors 128 and 130 that are series connected between ground and input terminal 132 of antenna system 20.

If transmitter 14 includes tetrode vacuum tube amplifiers, matching network 18 must be arranged so it induces a phase shift that is a multiple (including one) of 180° between antenna system 20 and the output of the high power, tetrode vacuum tube amplifier. This is because high power tetrode vacuum tube amplifiers are current, rather than voltage, sources.

Figure 9:
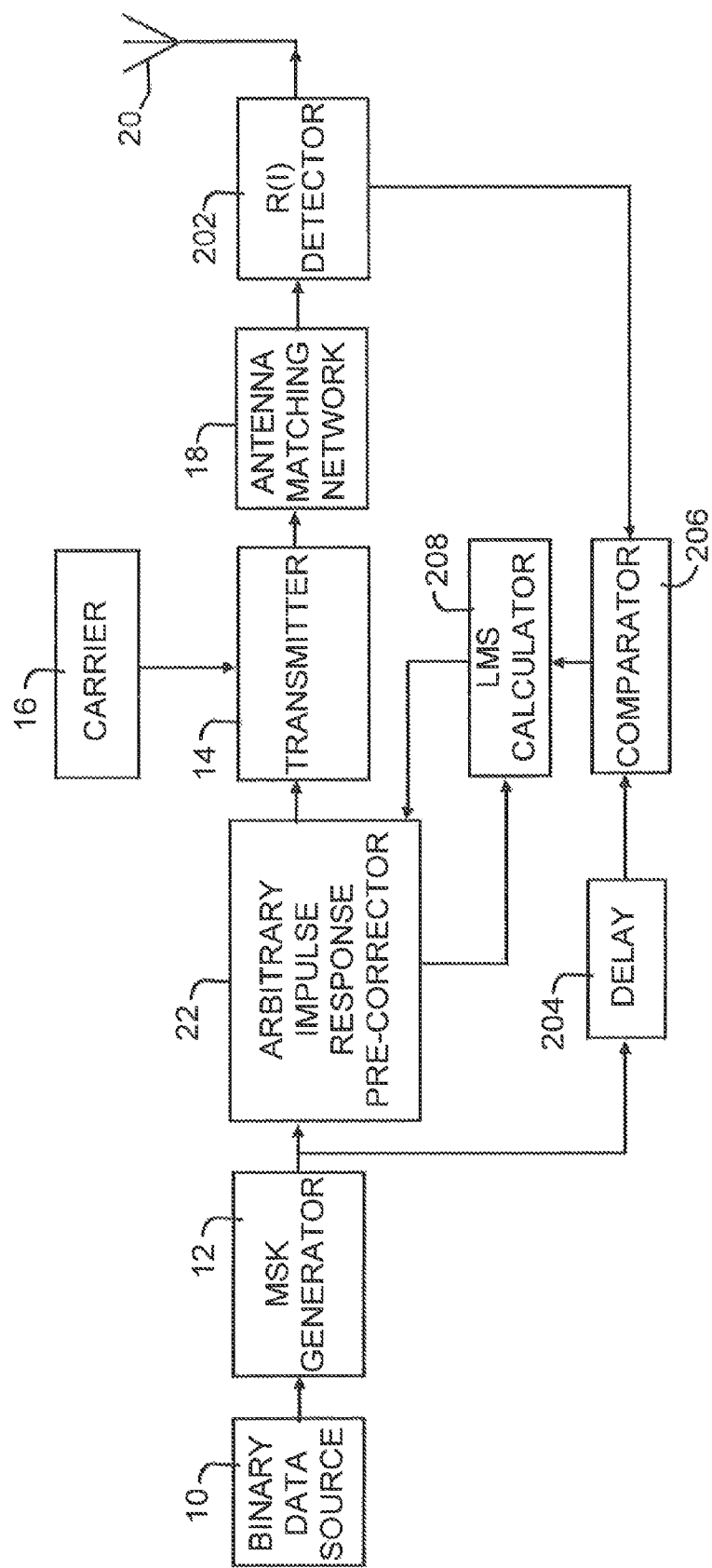
FIG. 9 is a block diagram of another embodiment of a VLF transmitter system including an arbitrary impulse response pre-corrector.

Reference is now made to the transmitter system illustrated by the block diagram of FIG. 9. In the system illustrated in FIG. 9, pre-corrector 22 includes a FIR filter having the same configuration as the FIR filter of FIG. 4. In addition, the system of FIG. 9 is able to automatically adjust coefficients $B_i$ . . . $B_1$. The system of FIG. 9 is highly advantageous in environments subject to substantial changes in transmission conditions, due, for example, to weather and ground conductivity variations because it has (1) effectively continuous monitoring of the conditions of antenna system 20 and (2) adjustments to pre-corrector 22 so the output of matching network 18 changes to compensate for antenna system changes, including changes in the impedance of the terrain on which the antenna system is located. As a result, the wave emitted by antenna system 20 includes modulation components having substantially the same wave shape as the wave at the output of generator 12 even though there are substantial dynamic changes in the impedance of and seen by antenna system 20.

In the system of FIG. 8, the coefficients ($B_i$ . . . $B_1$) of the FIR filter of pre-corrector 22 are adjusted in response to a comparison of (1) the theoretical shape of the wave emitted by antenna system 20, as derived by the output of MSK generator 12, and (2) an indication of the actual shape of the wave emitted by the antenna system, as sensed by detector 202, which is connected between matching network 18 and antenna system 20. Detector 202 monitors the real component of the complex current network 18 applies to antenna system 20. (It is known that the real component of a complex current, having real and imaginary components, applied to an antenna is a replica of the wave shape of the wave emitted by the antenna.) The outputs of generator 12 and detector 202 are continuously monitored or are monitored many times during each cycle of the frequency modulated waves generator 12 and matching network 18 produce so that the wave shapes of the waves emitted by the generator and the antenna system 20 are compared. To this end, the output of generator 12 is applied to delay element 204, having a delay time equal to the time it takes for the output of generator 12 to propagate to the output of matching network 18. The outputs of delay element 204 and detector 202 are applied to comparator 206, having an output having a value equal to the differences in the outputs of the delay element and the detector, and thus the differences in the theoretical and actual outputs of the modulation wave shape of the signal emitted by antenna system 20.

The difference indicating output of comparator 206 is applied to least mean square (LMS) calculator 208 that squares the magnitude of the difference indication and accumulates the squared difference over a predetermined number of bits of binary data source 10. Preferably the number of bits over which the differences are accumulated is sufficiently large as to assure a change in the value of almost all bits derived by source 10; for example, if source 10 is eight bit ASCII coded, the squared differences are accumulated over eight bits. LMS calculator 208 includes a least mean square algorithm of the well-known type as disclosed, for example, in the Wikipedia article entitled "Least mean squares filter." The least mean square algorithm of LMS calculator 208 responds to each accumulated squared difference and the present value of a particular coefficient $B_c$ of the FIR filter, as stored in source $66_c$, to calculate a new value for the particular coefficient $B_c$ of the FIR filter of pre-corrector 22.

Initially, an estimate of the coefficients $B_i \ldots B_1$ is loaded into sources $66_i \ldots 66_1$ of the FIR filter of pre-corrector 22. With the transmitter system of FIG. 9 running normally, the algorithm of LMS calculator 208 sequentially computes the value of each of coefficients $B_i \ldots B_1$ by sequentially and repeatedly responding to the squared accumulated differences of the output of comparator 206. The values of the coefficients of each new set typically differ slightly from the previous set of coefficient values.

These new coefficients are loaded into sources $66_i \ldots 66_1$ of the FIR filter, so a new calculation for the FIR filter coefficients is performed in response to a new set of accumulated squared differences resulting from the output of comparator 206. The operations repeat and after a sufficiently large number of iterations the coefficients converge to the correct values that significantly reduce the accumulated squared differences resulting from the output of comparator 206, to cause the shape of the modulation of the wave emitted by the antenna system 20 of FIG. 9 to match, as close as possible, the shape of the ideal signal derived by MSK generator 12 which is to be transmitted from the antenna system. Ultimately the accumulated squared differences resulting from the outputs of comparator 206 are virtually zero and there are no additional changes to coefficients $B_i \ldots B_1$, unless the impedance of and seen by antenna system 20 changes.

If the impedance of and seen by antenna system 20 changes, the wave shape of the modulation emitted by antenna system is likely to change, resulting in a change in the output of detector 202, so the accumulated squared differences resulting from the outputs of comparator 206 increase from their virtually zero value. In response to the increases in the accumulated squared differences resulting from the outputs of comparator 206, the coefficients $B_i \ldots B_1$ are re-calculated as discussed previously in connection with initial operation of the pre-corrector of FIG. 9. Usually the re-calculation of the coefficients is performed much more quickly than during the initial calculation because the wave shape sensed by detector 202 does not usually change by large amounts during normal operation.

There are several benefits of the disclosed transmitter system which are summarized as follows: (1) increased data rate; (2) reduction in antenna size and cost for a given data rate; (3) much larger range of possible modulation types for various applications; and (4) decrease in antenna voltage stresses to permit higher radiated power in many cases. All of these benefits can be used in various combinations to create a much larger trade space than the present state of the art permits.

While there have been described and illustrated specific embodiments of the invention, it will be clear that variations in the details of the embodiments specifically illustrated and described can be made without departing from the true spirit and scope of the invention as defined in the appended claims.

What is claimed is:

1. A radio transmitter system arranged to be responsive to a binary signal and arranged for driving a narrow bandwidth electromagnetic wave antenna system, the transmitter system comprising: a generator adapted to be responsive to the binary signal for deriving a first output signal having frequency coded values dependent upon the values of binary bits of the binary signal, the frequency coded values representing the wave shape of the instantaneous amplitude of a first wave indicative of the values of binary bits of the binary signal; an arbitrary impulse response signal processor arrangement arranged to be responsive to the first output signal and having an output for deriving a second output signal having components representing the shape of a modulating wave having a variable amplitude envelope and the frequencies of the frequency coded values; a source for deriving another output having values in accordance with amplitude values of a carrier frequency; a transmitter connected to be responsive to the second output signal and the another output and having an output for deriving a third output signal having modulation with a shape that is a substantial replica of the represented shape of the modulating wave, the third output signal of the transmitter being adapted to be supplied to the antenna system; components of the antenna system and components between the output of the arbitrary impulse response signal processor arrangement and the antenna system and the bit rate of the binary signal being such that they cause the signal emitted by the antenna system to include modulation having a shape that differs substantially from the shape of the first wave, but for the arbitrary impulse response signal processor arrangement; the arbitrary impulse response signal processor arrangement being arranged so the signal emitted by the antenna system includes modulation having a shape that is substantially the same as the shape of the first wave.

2. The transmitter system of claim 1 wherein the arbitrary impulse response signal processor arrangement includes coefficients having values (a) based on impedance values of components between the output of the arbitrary impulse response signal processor arrangement and an the antenna system and (b) impedance values of the antenna system.

3. The transmitter system of claim 2 wherein the arbitrary impulse response signal processor arrangement includes a finite impulse response filter including the coefficients.

4. The transmitter system of claim 2 wherein the arbitrary impulse response signal processor arrangement includes an inverse Fourier transformer arrangement having coefficients representing the inverse frequency responses of the antenna system and components between the arbitrary impulse response signal processor arrangement output and the antenna system.

5. The transmitter system of claim 1 wherein the arbitrary impulse response signal processor arrangement includes a finite impulse response filter having coefficients having values based on the square of the differences between the shapes of the modulation emitted by the antenna system and the first wave.

6. The transmitter system of claim 5 further including a detector arrangement for effectively dynamically monitoring the shape of the modulation emitted by the antenna system, and a processing arrangement arranged to be responsive to differences between the effectively monitored shape and the shape of the first wave for modifying the values of the coefficients.

7. The transmitter system of claim 1 wherein the generator is arranged so the values of the first output signal are based on minimum shift key modulation or Gaussian minimum shift key modulation of the binary signal.

8. The transmitter system of claim 1 wherein the transmitter includes first and second parallel processing branches arranged to be responsive to a signal derived from the second signal, the first branch being arranged to derive a plural level output signal having first and second values determined by the polarity of an input to the first branch, the second branch being arranged to derive a fourth output signal having values based on (a) a variable amplitude based on the amplitude of the envelope of the input of the second branch and the amplitude of the carrier frequency and which includes the carrier frequency amplitude, but does not include harmonics of the carrier frequency; and a power amplifier arrangement responsive to the plural level signal and the fourth output signal for deriving the third output signal so the third output signal includes frequency variations representing bits of the binary signal and has sufficient power to enable the antenna system to transmit a high power signal.

9. The transmitter system of claim 8 further including an impedance matching circuit connected to be responsive to the transmitter output for coupling the third output signal to the antenna system.

10. The transmitter system of claim 9 wherein the power amplifier arrangement includes a class D power amplifier having a low pass output filter, the amplifier arrangement being connected to be responsive to a bi-level output resulting from a comparison of the amplitudes of the plural level output and the fourth output signal; impedances between the class D amplifier output and an input to the antenna system, including impedances of the impedance matching network, being arranged to introduce a phase shift that is an odd multiple of 90 degrees on the class D amplifier output voltage.

11. The transmitter system of claim 8 wherein the power amplifier arrangement includes a class D power amplifier having a low pass output filter, the power amplifier being connected to be responsive to a bi-level output resulting from a comparison of the amplitudes of the bi-level output and the fourth output signal.

12. The transmitter system of claim 11 wherein impedances between the class D amplifier output and an input to the antenna are arranged to introduce a phase shift that is an odd multiple of 90 degrees, including one, on the class D amplifier output voltage.

13. The transmitter system of claim 1 wherein the transmitter includes first and second processing channels arranged to be responsive to a modulated RF carrier having modulation including the first output signal; the first and second channels respectively including first and second amplitude comparators for respectively deriving first and second comparator outputs, each having a value dependent on the value of the amplitude of the frequency coded signal relative to another value; and a signal combiner arranged to (a) have inputs resulting from the first and second comparator outputs, and (b) derive an output wave resulting in the third output signal.

14. The transmitter system of claim 13 wherein the first and second comparators have first inputs arranged to be responsive to complementary indications of the amplitude of the first output signal and second inputs arranged to be responsive to complementary indications of the amplitude of the carrier frequency, the first channel including a first processing arrangement arranged to be responsive to (a) the first comparator output, (b) first representations of a first rectangular wave (i) at the carrier frequency (ii) having a duty cycle of 25% and (iii) a first phase, and (c) second representations of a second rectangular wave (i) at the carrier frequency (ii) having a duty cycle of 25% and (iii) a second phase; the first channel being arranged to be responsive to the first processing arrangement for deriving a first sinusoidal wave having a variable amplitude linearly proportional to the amplitude of the second output signal; the second channel including a second processing arrangement arranged to be responsive to (a) the second comparator output, (b) the first representations, and (c) third representations of a third rectangular wave (i) at the carrier frequency (ii) having a duty cycle of 25% and (iii) a third phase; the second channel being arranged to be responsive to the second processing arrangement for deriving a second sinusoidal wave having a variable amplitude linearly proportional to the amplitude of the second output signal; the first and second sinusoidal waves being phase displaced by an amount determined by the frequency of the frequency coded values of the first output signal; the signal combiner being arranged to derive the output wave in response to the sum of the first and second sinusoidal waves.

15. The transmitter system of claim 13 wherein the first comparator is arranged to compare an indication of the amplitude of the modulated RF carrier with zero and to cause the plural level signal to change from a first level to a second level each time the indication of the amplitude of the modulated RF carrier crosses zero and the second comparator is arranged to compare an indication of the amplitude of the envelope of the modulated RF carrier with an indication of the amplitude of a sloping periodic wave having a frequency much greater than the carrier frequency and to cause the second comparator output signal to change from a first bi-level to a second bi-level each time the indication of the amplitude of the envelope of the modulated RF carrier crosses the indication of the amplitude of the sloping periodic wave, the signal combiner being arranged to be responsive to the plural level signal and the second comparator output signal after filtering for removing frequencies greater than harmonics of the carrier frequency for deriving a high power bi-level signal that changes from a first bi-level to a second bi-level each time the plural level signal crosses the second comparator output signal after said filtering, a low pass filter connected to be responsive to the high power bi-level signal for removing frequencies greater than harmonics of the carrier frequency for deriving the output wave.

16. The transmitter system of claim 1 wherein the carrier frequency is in the VLF or LF range.

17. The transmitter system of claim 1 further including a source of the binary signal.

18. The transmitter system of claim 17 further including the antenna system.

19. The transmitter system of claim 1 further including the antenna system.

20. A radio transmitter system arranged to be responsive to a binary signal and arranged for driving a narrow bandwidth electromagnetic wave antenna system, the transmitter system comprising: a generator adapted to be responsive to the binary signal for deriving a first output signal having frequency coded values dependent on the values of binary bits of the binary signal, the frequency coded values representing the wave shape of the instantaneous amplitude of a first wave indicative of the values of binary bits of the binary signal; an arbitrary impulse response signal processor arrangement arranged to be responsive to the first output signal and having an output for deriving a second output signal having components representing the shape of a modulating wave having a variable amplitude envelope and the frequencies of the frequency coded values; a source for deriving another output having values in accordance with amplitude values of a carrier frequency; a transmitter connected to be responsive to the second output signal and the another output and having an output for deriving a third output signal having modulation with a shape that is a substantial replica of the represented shape of the modulating wave, the third output signal being adapted to be supplied to the antenna system; the arbitrary impulse response signal processor arrangement including a data processor arrangement having coefficients having values (a) based on impedance values of components between the output of the arbitrary impulse response signal processor arrangement and the antenna system and (b) impedance values of the antenna system.

21. The transmitter system of claim 20 wherein the signal processor arrangement includes a finite impulse response filter including the coefficients.

22. The transmitter system of claim 20 wherein the signal processor arrangement includes an inverse Fourier transformer arrangement having coefficients representing the inverse frequency responses of the antenna system and components between the arbitrary impulse response signal processor arrangement output and the antenna system.

23. A radio transmitter system arranged to be responsive to a binary signal and arranged for driving a narrow bandwidth electromagnetic wave antenna system, the transmitter system comprising: a generator adapted to be responsive to the binary signal for deriving a first output signal having frequency coded values dependent on the values of binary bits of the binary signal, the frequency coded values representing the wave shape of the instantaneous amplitude of a first wave indicative of the values of binary bits of the binary signal; an arbitrary impulse response signal processor arrangement arranged to be responsive to the first output signal and having an output for deriving a second output signal having components representing the shape of a modulating wave having a variable amplitude envelope and the frequencies of the frequency coded values; a source for deriving another output having values in accordance with amplitude values of a carrier frequency; a transmitter connected to be responsive to the second output signal and the another output and having an output for deriving a third output signal having modulation with a shape that is a substantial replica of the represented shape of the modulating wave, the third output signal being adapted to be supplied to the antenna system; the arbitrary impulse response signal processor arrangement including a finite impulse response filter having coefficients having values based on the square of the differences between the shapes of the modulation emitted by the antenna system and the first wave.

24. The transmitter system of claim 23 further including a detector arrangement for effectively dynamically monitoring the shape of the modulation wave emitted by the antenna system, and a processing arrangement arranged to be responsive to differences between the effectively monitored shape and the shape of the first wave for modifying the values of the coefficients.

25. The transmitter system of claim 23 wherein the carrier frequency is in the VLF or LF range.

26. A radio transmitter system arranged to be responsive to a binary signal and arranged for driving an electromagnetic wave antenna system, the transmitter system comprising: a signal processing arrangement arranged to be responsive to the binary signal for deriving a first output representing a frequency coded signal having frequency variations dependent on the values of binary bits of the binary signal and envelope amplitude variations; a source for deriving a second output having values in accordance with amplitude values of a carrier frequency; a transmitter arranged to be responsive to the first and second outputs for deriving a modulated signal having modulation having an amplitude that is linearly proportional to the envelope amplitude variations and frequencies that deviate linearly from the carrier frequency by an amount that is linearly proportional to the frequency variations of the frequency coded signal; and circuitry for supplying the modulated signal to the antenna.

27. The transmitter system of claim 26 wherein the transmitter is arranged to derive a third output having values dependent on amplitude modulation of the second output by the first output; the transmitter including first and second processing channels arranged to be responsive to the third output; the first and second channels respectively including first and second amplitude comparators for respectively deriving first and second comparator outputs, each having a value dependent on the value of the amplitude of the third output relative to another value; and a signal combiner arranged to (a) have inputs resulting from the first and second comparator outputs, and (b) derive the modulated signal.

28. The system of claim 27 wherein the first and second comparators have first inputs arranged to be responsive to complementary indications of the third output and second inputs arranged to be responsive to complementary indications of the second output, the first and second comparators being arranged to derive first and second bi-level outputs dependent on the relative values of the first and second inputs thereof; the first channel including a first processing arrangement arranged to be responsive to (a) the first bi-level output, (b) first representations of a first rectangular wave (i) at the carrier frequency (ii) having a duty cycle of 25% and (iii) a first phase, and (c) second representations of a second rectangular wave (i) at the carrier frequency, (ii) having a duty cycle of 25%, and (iii) a second phase; the first channel being arranged to be responsive to the first processing arrangement for deriving a first sinusoidal wave; the second channel including a second processing arrangement arranged to be responsive to (a) the second bi-level output, (b) the first representations, and (c) third representations of a third rectangular wave (i) at the carrier frequency (ii) having a duty cycle of 25% and (iii) a third phase; the second channel being arranged to be responsive to the second processing arrangement for deriving a second sinusoidal wave; the signal combiner being arranged to derive the modulated signal in response to the sum of the first and second sinusoidal waves.

29. The system of claim 27 wherein the transmitter is arranged to derive a third output having values dependent on amplitude modulation of the second output by the first output; the first comparator being arranged to compare the third output with zero so that the first comparator derives, as the first comparator output, first and second opposite polarity levels of the same amplitude in response to the amplitude of the third output being respectively above and below zero; the second channel being arranged to derive a fourth output having variations in accordance with variations of the amplitude of the envelope of the third output; the second comparator being arranged to compare the fourth output with values determined by a high frequency wave having sloping sides and a frequency much greater than the carrier and derive, as the second comparator output, the first and second opposite polarity levels of the same amplitude in response to the amplitude of the fourth output being respectively above and below the amplitude of the high frequency wave; the second channel being arranged to supply the second comparator output to the signal combiner without indications at the frequency of the high frequency wave and waves higher thereof; the signal combiner including a third comparator arranged to be responsive to the first and second comparator outputs for deriving a high power bi-level output that changes value each time the first and second comparator outputs change relative to each other, and a low pass filter connected to be responsive to the high power bi-level output for preventing passage of harmonics of the carrier frequency.

30. The system of claim 26 wherein the carrier frequency is in the VLF or LF range.

31. A method of transmitting, with a narrow bandwidth electromagnetic wave antenna system, an electromagnetic wave in response to a binary signal, the method comprising: responding to the binary signal by deriving a first output signal having frequency coded values dependent upon the values of binary bits of the binary signal, the frequency coded values representing the wave shape of the instantaneous amplitude of a first wave indicative of the values of binary bits of the binary signal; responding to the first output signal by deriving a second output signal having components representing the shape of a modulating wave having a variable amplitude envelope and the frequencies of the frequency coded values; deriving another output having values in accordance with amplitude values of a carrier frequency; responding to the second output signal and the another output by deriving a third output signal having modulation with a shape that is a substantial replica of the represented shape of the modulating wave, supplying the third output signal to the antenna system; components of the antenna system and components of elements between the second output and the antenna system and the bit rate of the binary signal being such that they cause the signal emitted by the antenna system to include modulation having a shape that differs substantially from the shape of the first wave, but for the components of the second output signal; the components of the second output signal being such that the signal emitted by the antenna system includes modulation having a shape that is substantially the same as the shape of the first wave.

* * * * *